(12) United States Patent
Pretl et al.

(10) Patent No.: US 6,989,718 B2
(45) Date of Patent: Jan. 24, 2006

(54) CIRCUIT AND METHOD FOR PHASE LOCKED LOOP CHARGE PUMP BIASING

(75) Inventors: Harald Pretl, Schwertberg (AT); Michael Wilhelm, Plainsboro, NJ (US)

(73) Assignee: Infineon Technologies AG, München (DE)

(*) Notice: Subject to any disclaimer, the term of this patent is extended or adjusted under 35 U.S.C. 154(b) by 47 days.

(21) Appl. No.: 10/760,766

(22) Filed: Jan. 20, 2004

(65) Prior Publication Data
US 2005/0156673 A1    Jul. 21, 2005

(51) Int. Cl.
H03L 7/00    (2006.01)

(52) U.S. Cl. ......................................... 331/16; 327/157
(58) Field of Classification Search .................. 331/16, 331/34, 40, 44, 177 R, DIG. 2; 327/148, 327/157, 530, 534–537
See application file for complete search history.

(56) References Cited

U.S. PATENT DOCUMENTS

| | | | |
|---|---|---|---|
| 5,448,598 A * | 9/1995 | Yousefi et al. ............... | 375/376 |
| 5,631,587 A | 5/1997 | Co et al. | |
| 5,945,855 A * | 8/1999 | Momtaz ...................... | 327/157 |
| 6,115,586 A | 9/2000 | Bezzam et al. | |
| 6,118,346 A * | 9/2000 | Olgaard ........................ | 331/17 |
| 6,278,333 B1 | 8/2001 | Le et al. | |
| 6,292,061 B1 * | 9/2001 | Qu ............................... | 331/17 |
| 6,466,058 B1 | 10/2002 | Goldman | |
| 6,512,404 B2 | 1/2003 | Ruegg et al. | |
| 6,650,156 B1 * | 11/2003 | Reid et al. ................... | 327/157 |
| 6,664,828 B2 | 12/2003 | Gauthier et al. | |
| 6,859,108 B2 * | 2/2005 | Abbasi et al. ................ | 331/17 |
| 6,876,238 B1 * | 4/2005 | Kelkar et al. ................ | 327/157 |
| 2003/0119466 A1 | 6/2003 | Goldman | |

OTHER PUBLICATIONS

"A CMOS Monolithic βΣ-Controlled Fractional-N Frequency Synthesizer for DCS-1800", Bram de Muer and Michael S.J. Steyaert, IEEE Journal of Solid-State Circuits, vol. 37, No. 7, Jul., 2002, pp. 835-844.

* cited by examiner

Primary Examiner—My-Trang Nu Ton
Assistant Examiner—Cassandra Cox
(74) Attorney, Agent, or Firm—Eschweiler & Associates, LLC

(57) ABSTRACT

Phase locked loops systems and control apparatus therefor are presented, in which a first charge pump bias current is generated according to a sensed VCO tuning voltage and a second generally constant bias current is provided. The provision of the first and second bias currents allows compensation for non-linear VCO tuning sensitivity. Methods are also presented for biasing a charge pump, including selectively providing a first current to the charge pump using a first current source, controlling the first current according to a VCO tuning voltage of the phase locked loop system, and providing a substantially constant second current to the charge pump.

33 Claims, 7 Drawing Sheets

US 6,989,718 B2

CIRCUIT AND METHOD FOR PHASE LOCKED LOOP CHARGE PUMP BIASING

FIELD OF INVENTION

The present invention relates generally to phase locked loop systems and more particularly to control apparatus and methods for enhanced phase locked loop tuning stability.

BACKGROUND OF THE INVENTION

Modern digital systems and communications devices often include components to generate periodic waveforms or signals having tuned frequency and/or phase characteristics. For example, frequency synthesizers are often employed in communications systems for generating programmable frequencies, which are used for timing or frequency translation purposes. Phase locked loop (PLL) systems are closed loop circuits often employed in frequency synthesis applications, in which an oscillator is controlled such that the oscillator maintains a constant phase angle relative to a reference signal. A conventional PLL system 10 is illustrated in FIG. 1, including a forward path with a phase detector 14 (e.g., sometimes referred to as a phase-frequency detector) receiving a frequency reference input 12, a charge pump 16, a loop filter 18, and a voltage controlled oscillator (VCO) 20 that generates a frequency output signal 22. The VCO 20 is a circuit that generates an output 22 having a frequency that is proportional to the VCO input voltage, sometimes referred to as the VCO tuning voltage.

A feedback circuit is provided, including a divide by N counter 24 that divides the output signal by an integer number "N" to generate a feedback signal that is compared to the frequency reference input 12 by the phase detector 14. The feedback signal is generally at a lower frequency than the frequency output signal 22, whereby a relatively low frequency reference input 12 (e.g., a crystal oscillator circuit) can be used to create a higher frequency output 22. The phase detector 14 compares the feedback frequency signal with the reference input signal 12 and generates an output that represents the phase difference of the two input signals. The phase detector output is typically and analog circuit that generates a single DC voltage, or a digital circuit implementing an exclusive-OR (XOR) or similar function by which one or more digital signals are generated, to control the charge pump 16. In the system 10, the phase detector output signal includes an UP signal and a DOWN signal that drive sourcing and sinking current sources of the charge pump 16, so as to increase or decrease the VCO tuning voltage input, respectively.

If the frequency reference input 12 and the feedback signal differ in frequency, the detector output (e.g., one of the UP and DOWN detector output signals) is a periodic signal at the difference frequency, sometimes referred to as a phase-error signal. This signal is used to generate the charge pump output, which is then filtered in the loop filter 18, where the loop filter 18 typically implements a low-pass transfer function. The output of the filter 18 is provided as the VCO tuning voltage input, used to set the VCO output frequency (e.g., the frequency output 22). For a given frequency reference input 12, the PLL system 10 eventually "locks" into a stable closed loop steady-state condition, in which the VCO 20 maintains a generally fixed relationship between the frequency output 22 and the frequency reference input 12 (e.g., where the output frequency is N times the input frequency).

In the design of frequency synthesizers and other systems that employ PLLs, it is often desirable for the PLL to operate over a relatively wide frequency band or tuning range. At the same time, the design of closed-loop PLL systems must also account for phase noise, overshoot, settling time, and spurious response, wherein the VCO tuning sensitivity affects the closed loop performance and stability. Conventional PLL systems, such as the system 10 of FIG. 1 typically include VCOs 20 having non-linear tuning sensitivity, measured in KHz/V or MHz/V. The tuning sensitivity variation of the VCO 20, in turn, limits the PLL system performance, wherein maximizing the system tuning range typically leads to highly non-linear VCO control characteristics over the full possible voltage range of the charge pump 16. Accordingly, there is a need for improved PLL systems by which the shortcomings of VCO tuning sensitivity variations can be mitigated.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention involves phase locked loop systems, as well as control circuits and charge pump current biasing methods therefor, in which a current is provided to a PLL charge pump according to a VCO tuning voltage. The invention may be employed in conjunction with phase locked loop systems for frequency synthesis or other applications, in which frequency output signals are to be generated, and may provide particular advantages in constructing PLL systems for which a wide tuning range is desired. The inventors have appreciated that conventional VCO circuits typically exhibit tuning sensitivity characteristics that vary somewhat inversely with the tuning voltage, wherein the tuning sensitivity $K_{VCO}$ (MHz/V) decreases as the VCO tuning voltage is increased. By adjusting a charge pump bias current according to the VCO tuning voltage, the variation in $K_{VCO}$ can be counteracted, to improve the performance of the entire PLL system.

One aspect of the invention provides a phase locked loop system that comprises a phase detector, a charge pump, a loop filter, a VCO, a feedback circuit, and a control circuit providing one or more currents to the charge pump. The phase detector provides one or more output signals according to a frequency reference input and a feedback signal, and the charge pump provides a charge pump output signal to the loop filter according to the phase detector output. The filter, in turn, provides a tuning voltage to the VCO, and the VCO creates a frequency output signal according to the tuning voltage. The feedback circuit provides the feedback signal to the phase detector according to the frequency output signal, for example, divided by an integer number "N".

The control circuit is coupled with the charge pump and the VCO, and comprises first and second current sources providing current to the charge pump. The first current source of the control circuit selectively provides a first current to the charge pump according to the tuning voltage output, which is substantially proportional to the tuning voltage output, and the second current source provides a second current to the charge pump, which is substantially constant. As illustrated and described further below, the inventors have found that providing a first bias current component that is proportional to the tuning voltage, together with a generally constant current component, can advantageously compensate for the conventional VCO tuning sensitivity variations, in order to improve the closed-loop PLL system response.

Another aspect of the invention relates to a control circuit for providing a bias current to a charge pump in a phase locked loop system. The control circuit comprises a first current source that provides a first current to the charge pump, where the first current is substantially proportional to a tuning voltage at a VCO input of the phase locked loop system. The control circuit also comprises a second current source that provides a second, substantially constant, current to the charge pump. In one embodiment, the first current source comprises an amplifier that receives the tuning voltage, as well as a current mirror circuit coupled with the amplifier, that selectively provides the first current to the charge pump according to an output of the amplifier. The current mirror circuit may further comprise a switching circuit to selectively discontinue the first current according to a control signal, leaving the charge pump bias current generally constant.

Yet another aspect of the invention provides a method of biasing a charge pump in a phase locked loop system, the method comprising selectively providing a first current to the charge pump using a first current source, controlling the first current according to a VCO tuning voltage of the phase locked loop system, and providing a second current to the charge pump, the second current being substantially constant. In one embodiment, the first current is controlled to be substantially proportional to the VCO tuning voltage, and the method may further comprise selectively discontinuing the first current according to a control signal.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
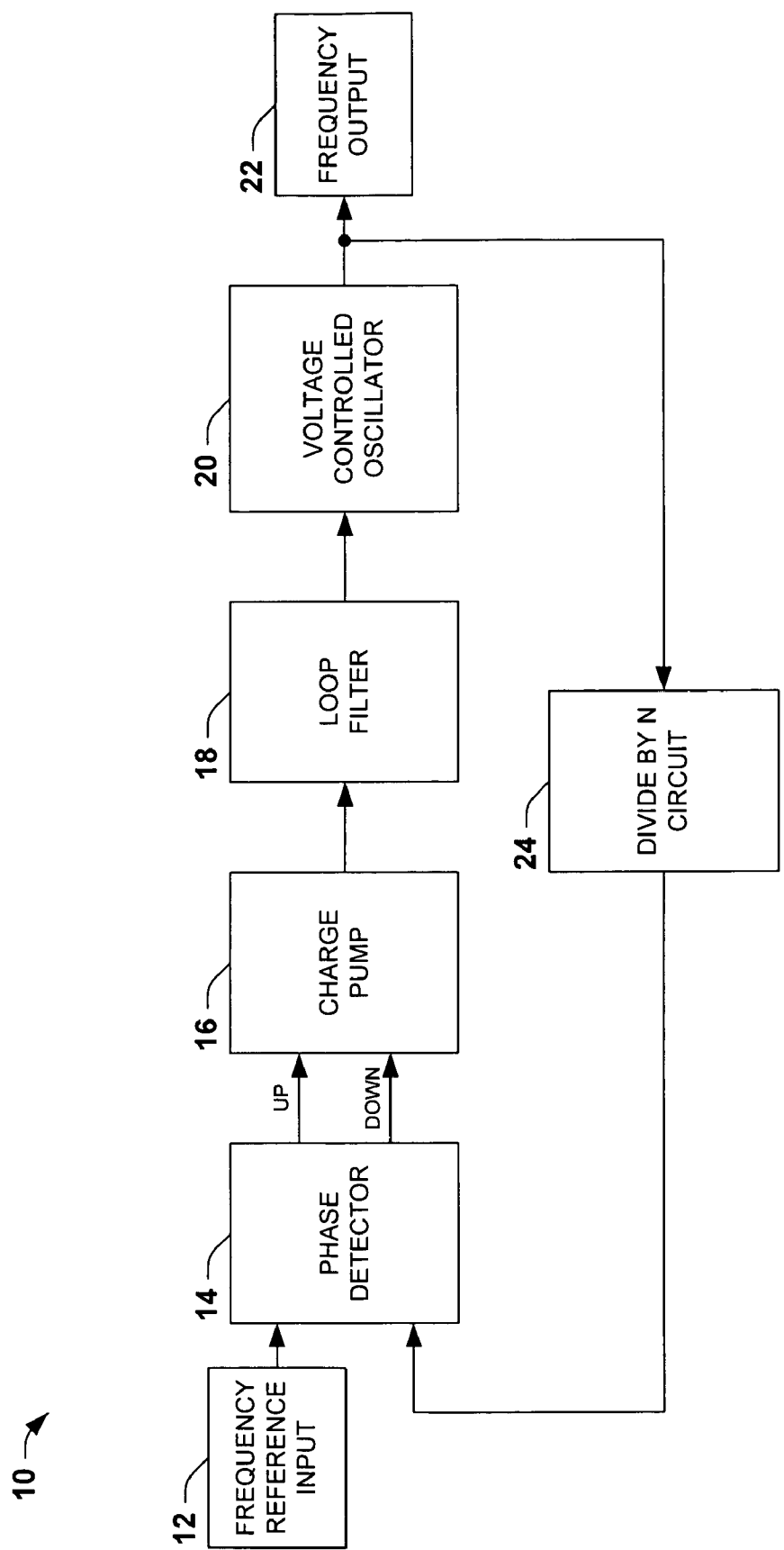
FIG. 1 is a schematic diagram illustrating a conventional phase locked loop (PLL) system.

One or more implementations of the present invention will now be described with reference to the attached drawings, wherein like reference numerals are used to refer to like elements throughout. The invention relates to phase locked loop systems and control circuits, wherein a charge pump bias current is provided that is substantially proportional to a VCO tuning voltage.

Figure 2:
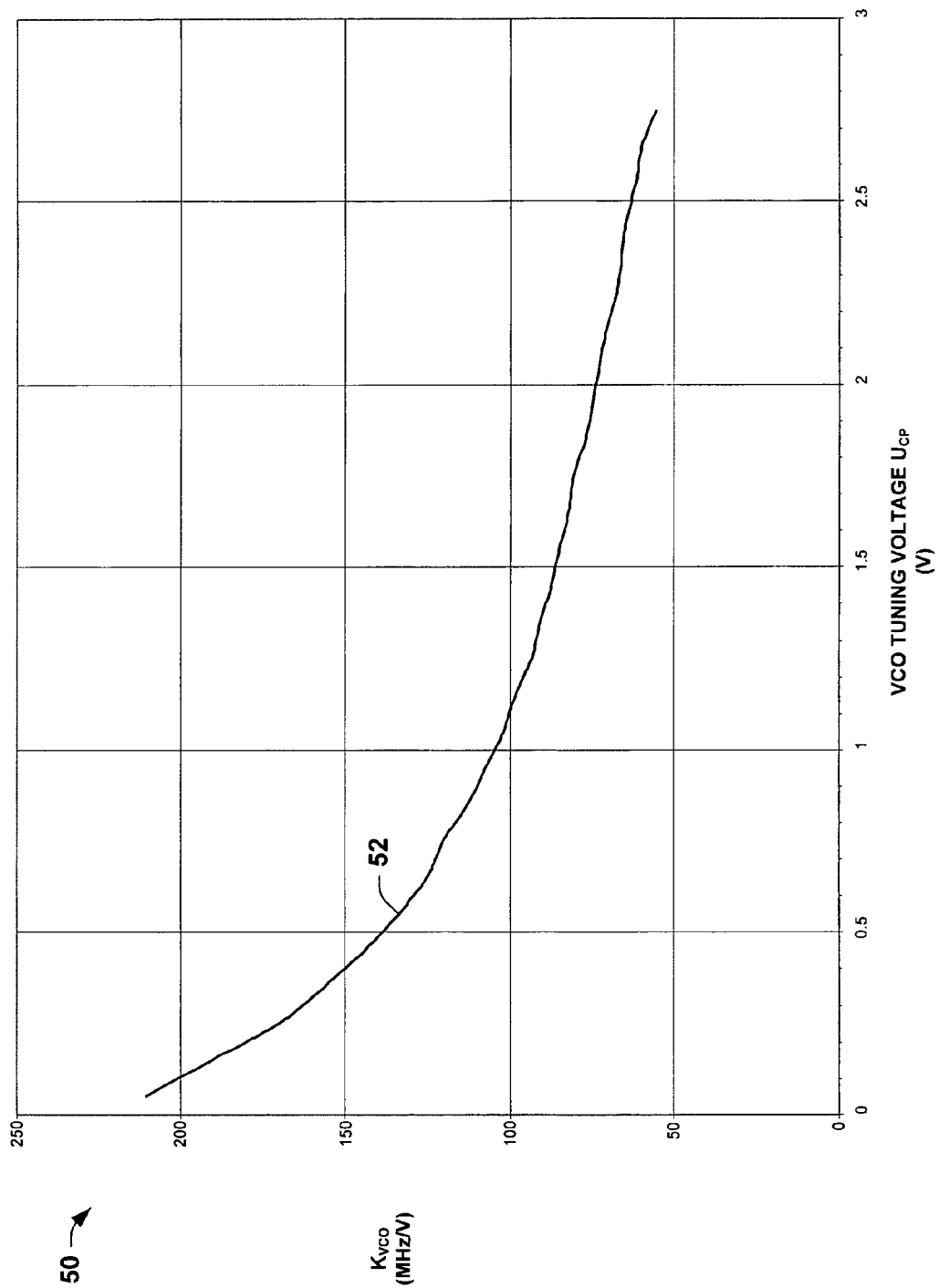
FIG. 2 is a plot showing a VCO tuning sensitivity characteristic $K_{VCO}$ as a function of VCO tuning voltage.

Referring initially to FIG. 2, a plot 50 is provided, in which a curve 52 illustrates VCO tuning sensitivity ($K_{VCO}$) in MHz/V as a function of VCO tuning voltage in volts. As can be seen from the plot 50, the tuning sensitivity $K_{VCO}$ (MHz/V) decreases as the VCO tuning voltage increases, wherein $K_{VCO}$ varies from about 200 MHz/V to about 50 MHz/V in the illustrated example (e.g., approximately +100% and −50%). Moreover, the curve 52 shows that the tuning sensitivity $K_{VCO}$ varies somewhat non-linearly with tuning voltage, but is generally linear over a large portion of the charge pump normal operating range (e.g., between about 0.4 and 2.1 V). Because of this tuning sensitivity variation, the loop design of conventional PLLs (e.g., PLL system 10 above) is difficult, wherein $K_{VCO}$ is one factor of the open-loop transfer function. Consequently, conventional PLL designs have thus far typically been a tenuous balance between loop bandwidth and overshoot, resulting in large variations in phase noise, settling time and spurious response.

The inventors have further appreciated that the VCO tuning sensitivity $K_{VCO}$ impacts the PLL closed-loop response, and that $K_{VCO}$ appears as a scaling factor in the open-loop PLL system transfer function L(s), as in the following equation 1:

$$1) \quad L(s) = \frac{K_\Phi K_{VCO}}{N} \frac{Z(s)}{s} = \frac{K_1 \cdot I_{CP} \cdot K_{VCO}}{N} \frac{Z(s)}{s},$$

in which $K_\Phi$ is proportional to the charge pump source/sink current, $K_1$ is the charge pump gain, N is the ratio between the output and reference input frequencies, and Z(s) is the loop filter transfer function.

In view of the relationship between the charge pump current $I_{CP}$ and $K_{VCO}$ in the system transfer function L(s), as well as the inverse $K_{VCO}$ variation as a function of tuning voltage, the inventors have appreciated that the PLL system closed-loop performance can be improved by adjusting or controlling a charge pump bias current according to the VCO tuning voltage. In addition, the inventors have also found that providing a charge pump bias current having a constant component as well as a component substantially proportional to the VCO tuning voltage can create a combined $I_{CP}*K_{VCO}$ product that is essentially constant as the tuning voltage varies, as illustrated further below in FIG. 6. This technique can be advantageously applied to PLL systems to relax the above-mentioned design tradeoffs between tuning range, performance, stability, etc. As a result, the invention facilitates design of PLL systems having stable, generally constant, open-loop transfer functions, thereby facilitating optimization of PLL system performance, even for large tuning ranges.

Figure 3:
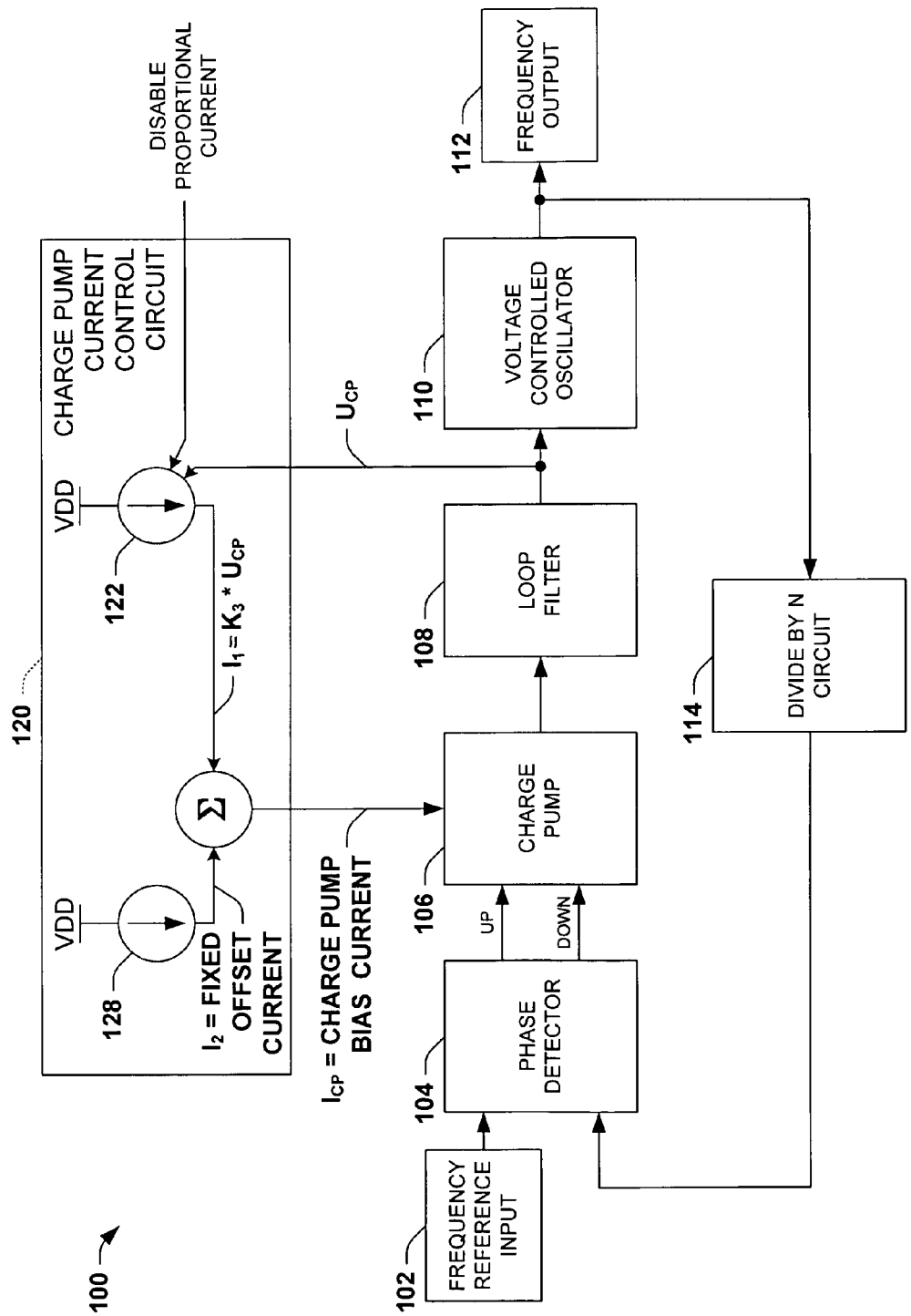
FIG. 3 is a schematic diagram illustrating an exemplary phase locked loop system and control circuit therefor in accordance with one or more aspects of the present invention.
Figure 4A:
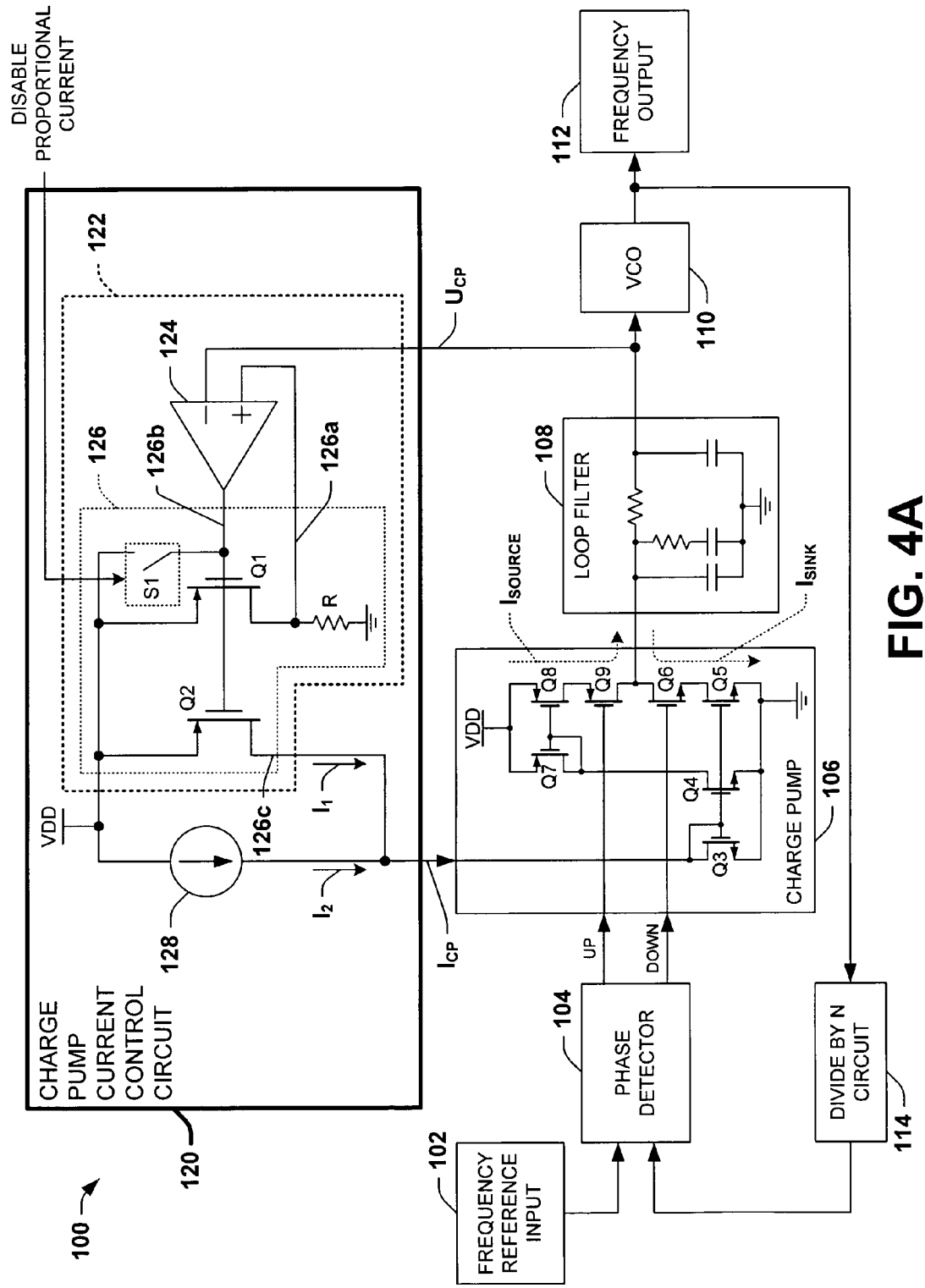
FIGS. 4A–4C are schematic diagrams illustrating an exemplary embodiment of the PLL system of FIG. 3.

FIGS. 3 and 4A–4C illustrate a preferred embodiment of certain aspects of the invention, in which a PLL system 100 is depicted. As illustrated in FIGS. 3 and 4A, the exemplary PLL system 100 comprises a phase detector 104, a charge pump 106, a loop filter 108, a voltage controlled oscillator (VCO) 110 providing a frequency output signal 112, and a feedback circuit including a divide by N counter 114. In addition, the system 100 comprises a charge pump current control circuit or system 120 that provides a charge pump bias current $I_{CP}$ according to a VCO tuning voltage $U_{CP}$. The phase detector 104 provides UP and DOWN phase detector output signals to the charge pump 106 according to a frequency reference input 102 and a feedback signal from the circuit 114. Any phase detector system or circuit 104 may be employed within the scope of the present invention, which provides one or more outputs indicative of a phase or frequency difference between the feedback signal and the reference input 102.

The charge pump 106 is coupled with the phase detector 104 to receive the phase detector UP and DOWN output signals, and provides a charge pump output signal at a charge pump output terminal according to the phase detector outputs. The exemplary charge pump 106 operates to selectively source a charge pump output current to the charge pump output terminal according to the UP signal, and to sink the charge pump output current from the charge pump output terminal according to the DOWN signal, so as to selectively raise or lower the signal voltage applied to the loop filter 108, where the charge pump output current is proportional to the charge pump bias current $I_{CP}$ provided by the control circuit 120. Any suitable charge pump may be employed within the scope of the invention, which operates to create an output signal according to the input signals from the phase detector 104 by selectively sinking and/or sourcing current based on the bias current $I_{CP}$.

As further illustrated in FIG. 4A, the exemplary charge pump 106 comprises MOS transistors Q3–Q7, wherein the charge pump bias current $I_{CP}$ from the control circuit 120 is mirrored from transistor Q3 to transistor Q5 to set the value of a sinking current $I_{SINK}$. When the DOWN signal actuates Q6, the current $I_{SINK}$ is withdrawn from the charge pump output terminal (e.g., from the loop filter input node) and conducted to ground through the transistors Q5 and Q6. In this arrangement, $I_{SINK}$ is substantially proportional to $I_{CP}$, by virtue of the current mirror coupling of Q3 and Q5. Similarly, the relative coupling of Q3 and Q4 creates a current through transistor Q7 that is proportional to $I_{CP}$. The current through Q7 is then mirrored to the transistor Q8 to establish a source current $I_{SOURCE}$, which is also proportional to $I_{CP}$. When the UP signal actuates the transistor Q9, the current $I_{SOURCE}$ is provided from a supply voltage VDD to the charge pump output terminal (e.g., to the loop filter input node) via the transistors Q8 and Q9. Where neither of the signals UP or DOWN are active, the transistors Q6 and Q9 are both off and the charge pump output voltage remains essentially constant.

The loop filter 108 receives the charge pump output signal and provides active or passive filtering thereof according to any suitable filtering transfer function. In the exemplary system 100, a five component passive low pass filter 108 is employed (FIG. 4A), by which high frequency noise components are removed from the charge pump output signal, although any suitable loop filter 108 may be employed within the scope of the present invention. The loop filter 108 provides a tuning voltage output $U_{CP}$ (e.g., a voltage signal) according to the charge pump output signal, as an input to the VCO 110. The tuning voltage $U_{CP}$ is also provided to the control circuit 120 for generating a first current $I_1$ in accordance with the invention, as discussed further below.

Figure 4B:
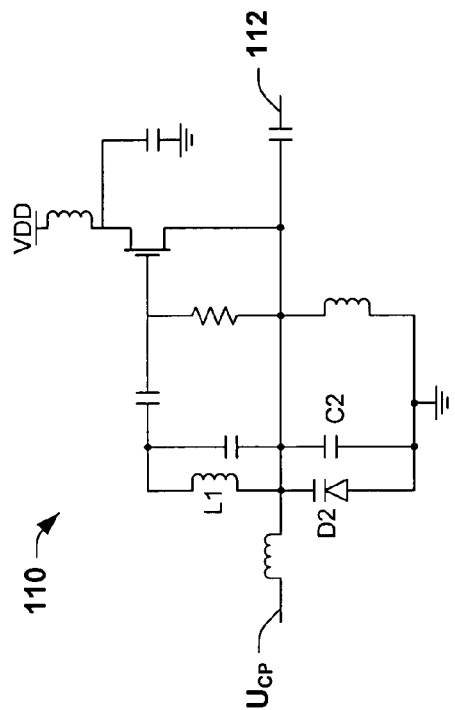

As illustrated in FIGS. 3, 4A, and 4B, the tuning voltage $U_{CP}$ is provided as an input to the VCO 110, which can be any suitable circuit or system that generates an alternating output signal 112 having a frequency that is determined by the amplitude of the tuning voltage signal $U_{CP}$ within the scope of the present invention. One possible implementation of the VCO 110 is illustrated in FIG. 4B. The VCO 110 receives the tuning voltage input $U_{CP}$ and generates the frequency output 112, wherein the frequency of oscillation is determined by the VCO components L1, C2, and D2. The diode D2 in this example is a varactor or varicap, which operates as a capacitor with reverse biasing, with the diode depletion zone forming a capacitor dielectric. As the amount of reverse biasing changes, the depletion zone width is changed, and accordingly, the effective capacitance changes, thus changing the resonant frequency of the oscillator circuit. In this manner, the frequency output signal 112 is provided by the VCO according to the tuning voltage $U_{CP}$.

The frequency output 112 is provided to the feedback circuit, which includes the divide by N counter 114. The divided output from the counter 114 is then provided as the feedback signal to the input of the phase detector 104. Any suitable feedback circuit can be employed within the scope of the invention, including but not limited to divide by N counters and/or gain stages, or even simple unity gain feedback of the frequency output signal 112 directly to the phase detector 104.

In accordance with the present invention, the bias current $I_{CP}$ is provided by the control circuit 120 to the charge pump 106 according to the tuning voltage $U_{CP}$. In the exemplary system 100, the charge pump current $I_{CP}$ has two components, $I_1$ and $I_2$, wherein $I_1$ is substantially proportional to the tuning voltage $U_{CP}$, and $I_2$ is substantially constant. In the exemplary control circuit 120, the first (e.g., proportional) current $I_1$ is provided by a first current source 122 and the second (e.g., constant) offset current $I_2$ is provided by a second current source 128. As used herein, substantial proportionality of two or more signals includes direct proportional relationships, and non-linear relationships, as well as inversely proportional relationships. In the preferred embodiment of the system 100, for example, $I_1$ increases as $U_{CP}$ increases, and vice versa by virtue of the operation of the exemplary charge pump control circuit 120 (e.g., $I_1=K_3*U_{CP}$, where $K_3$ is a constant). Furthermore, the second current can be a constant having a single value, or multiple constant values, for example, where the value of $I_2$ is programmable from a plurality of values, which may be programmed or selected based on a likewise programmable or selectable VCO range, wherein all such variant implementations are contemplated as substantially constant second currents within the scope of the present invention.

As illustrated in FIG. 3, the first source 122 senses or receives the tuning voltage $U_{CP}$ (e.g., from the loop filter output or from the VCO input), and generates the first current $I_1$ that is substantially proportional to the tuning voltage $U_{CP}$. In addition, the exemplary control circuit can receive a proportional current disable control signal, by which the first current source 122 can be disabled, thereby selectively discontinuing the first (e.g., proportional) current $I_1$. In this situation, the bias current $I_{CP}$ is equal to the constant second current $I_2$. However, with the first source 122 enabled, the bias current $I_{CP}$ has a proportional component and a fixed or offset component. The inventors have appreciated that this two-component bias current $I_{CP}$ can be employed so as to generally counteract the $K_{VCO}$ tuning sensitivity variation of the VCO 110, thereby facilitating a stable, generally constant, open-loop PLL system transfer function, and hence allowing further performance optimization than was possible with conventional PLL designs (e.g., PLL system 10 in FIG. 1 above). In addition, the dynamic adjustment of the charge pump bias current $I_{CP}$ also provides compensation for temporal and/or thermal drift in the PLL system components, including temperature changes in the $K_{VCO}$ characteristic, as well as compensation for manufacturing variations in fabricating different batches of integrated circuit devices that include PLL systems.

In this regard, the inventors have appreciated that the value of the VCO tuning sensitivity $K_{VCO}$ as a function of the tuning voltage $U_{CP}$ can be roughly described by the following equation 2:

$$2) \quad K_{VCO} = K_2 \frac{1}{U_{CP}},$$

where $K_2$ is substantially a constant. For example, as shown in FIG. 2, the value of $K_2$ in the operating range of the charge pump 106 from about 0.4 V to about 2.1 V is essentially constant. The inventors have further found that the above equation 2 is a reasonable approximation of the tuning sensitivity variation for most VCOs, and further, that similar tuning sensitivity variation is found for different selected operating bands of VCOs having multiple selectable frequency bands.

The exemplary control circuit 120 generates the first current $I_1$, which is generally proportional to the tuning voltage $U_{CP}$, wherein $I_1=K_3*U_{CP}$. As a result, the open loop transfer function L(s) for the system 100 may be written according to the following equation 3:

$$3) \quad L(s) = \frac{K_1 \cdot I_{CP} \cdot K_{VCO}}{N} \frac{Z(s)}{s} = \frac{K_1 K_2 K_3}{N} \frac{Z(s)}{s}.$$

Thus, the modified transfer function L(s) is essentially constant with respect to changes in the tuning voltage $U_{CP}$. This result facilitates designing PLL systems to accommodate large tuning ranges without disturbing loop stability and performance measures, to an extent not possible in the past.

Any suitable control circuit 120 may be provided within the scope of the invention, which provides a current according to the tuning voltage $U_{CP}$. The exemplary control circuit 120 senses the tuning voltage $U_{CP}$ at the VCO input, and selectively provides $I_1$ to the charge pump, where $I_1$ is substantially proportional to $U_{CP}$. In addition, the circuit 120 provides a second current $I_2$ to the charge pump, that is substantially constant, wherein the value of $I_2$ can be set according to a particular VCO design. For example, the $K_{VCO}$ vs. tuning voltage characteristic for a given VCO design can be simulated or measured (e.g., to derive a curve such as the curve 52 in FIG. 2). The inverse of this characteristic can then be plotted and curve fitting can be employed to determine a slope and an offset, where the offset value is used to derive the value of the fixed offset current $I_2$ in designing the second current source 128, and where the slope is used in designing the constant $K_3$ for the first current source 122 (e.g., in selecting the value of the resistor R in FIG. 4A below). In other possible embodiments of the present invention, the value of the fixed offset current $I_2$ can be programmable, for example, where the VCO 110 has programmable or selectable frequency ranges. The control circuit 120 also allows selective discontinuation of $I_1$ according to a control signal as described further below.

Figure 4C:
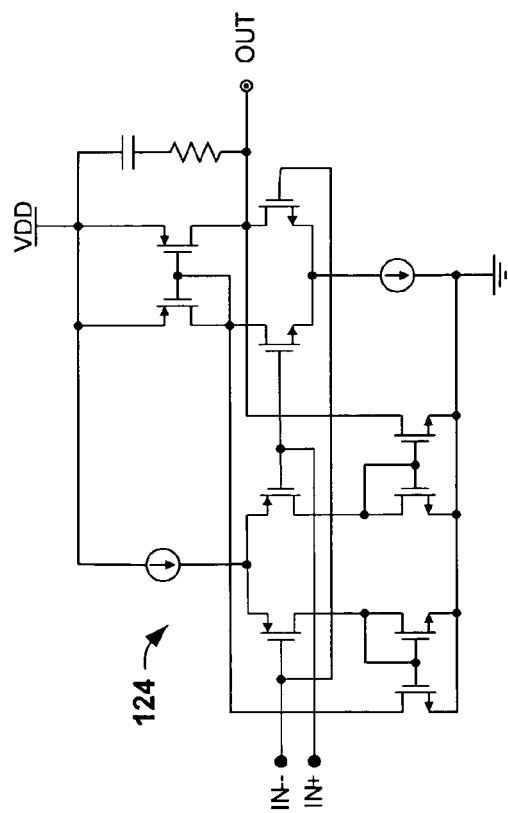

As illustrated in further detail in FIG. 4A, the exemplary control circuit 120 provides a means for providing the first current $I_1$ to the charge pump bias current input, that is substantially proportional to the tuning voltage $U_{CP}$, where the charge pump bias current $I_{CP}$ is the sum of the first and second currents $I_1$ and $I_2$. The control circuit 120 comprises a first current source 122 coupled with the charge pump 106 and the VCO 110. The source 122 comprises an amplifier 124 receiving the tuning voltage output $U_{CP}$ from the loop filter 108, and a current mirror circuit 126 coupled with the amplifier 124, wherein the current mirror circuit 126 selectively provides the first current $I_1$ to the bias current input of the charge pump bias 106 according to the output of the amplifier 124. In a preferred implementation, the amplifier 124 comprises an operational amplifier (e.g., op-amp) that is capable of substantially rail-to-rail operation, wherein one such exemplary op-amp implementation 124 is illustrated in FIG. 4C. However, any suitable amplifier may be employed within the scope of the present invention. In other possible embodiments, for example, the amplifier may include further feedback elements and more than one op-amp, so as to implement second or higher order amplification of the tuning voltage $U_{CP}$, to thereby better counteract any non-linear KVCO tuning sensitivity characteristics of the VCO 110.

The exemplary current mirror circuit 126 comprises a first transistor Q1 having a first source/drain coupled with a supply voltage VDD, a second source/drain coupled with a first node 126a, and a gate coupled with a second node 126b. The current mirror circuit 126 further comprises a second transistor Q2 having a first source/drain coupled with VDD, a second source/drain coupled with a third node 126c, and a gate that is also coupled with the second node 126b, where the third node 126c is coupled with the charge pump bias current input. The third node 126c thus forms a summing node whereat the currents $I_1$ and $I_2$ are summed to create the charge pump bias current $I_{CP}$. The mirror circuit 126 also comprises a resistor R, having a value of a few kOHMs in this example, which is coupled between the first node 126a and ground. The amplifier 124 comprises an inverting first input terminal coupled with the loop filter 108 and the VCO 108 to receive the tuning voltage output $U_{CP}$, and a non-inverting second input terminal coupled with the first node 126a.

The amplifier output terminal provides an amplifier output to the second node 126b. In operation, the amplifier 124 maintains a voltage at the second node 126b (e.g., at the gates of transistors Q1 and Q2) such that a voltage at the first node 126a is substantially proportional to the tuning voltage $U_{CP}$, thus creating a current through the transistor Q1 and the resistor R that is substantially proportional to the tuning voltage $U_{CP}$. Through the mirroring interconnection of Q1 and Q2, the transistor Q2, in turn, provides the first current $I_1$ to the third node 126c, wherein the first current $I_1$ is substantially proportional to the current through the resistor R. It is noted in this regard, that in steady state, the voltage at the first node 126a is equal to $U_{CP}$, and thus the current through the resistor R (e.g., $U_{CP}/R$) is proportional to the VCO tuning voltage $U_{CP}$. Consequently, the value of the first current $I_1$ itself is substantially proportional to the value of $U_{CP}$.

The exemplary current mirror circuit 126 further comprises an optional switching circuit to selectively discontinue the first current $I_1$ according to an external disable control signal, as shown in FIGS. 3 and 4A. In the example of FIG. 4A, the current mirror circuit 126 includes a switch S1 (e.g., a transistor or any suitable switching device) coupled between the second node 126b and VDD to selectively discontinue the first current $I_1$ by turning off Q1 and Q2 according to the disable control signal.

Figure 5:
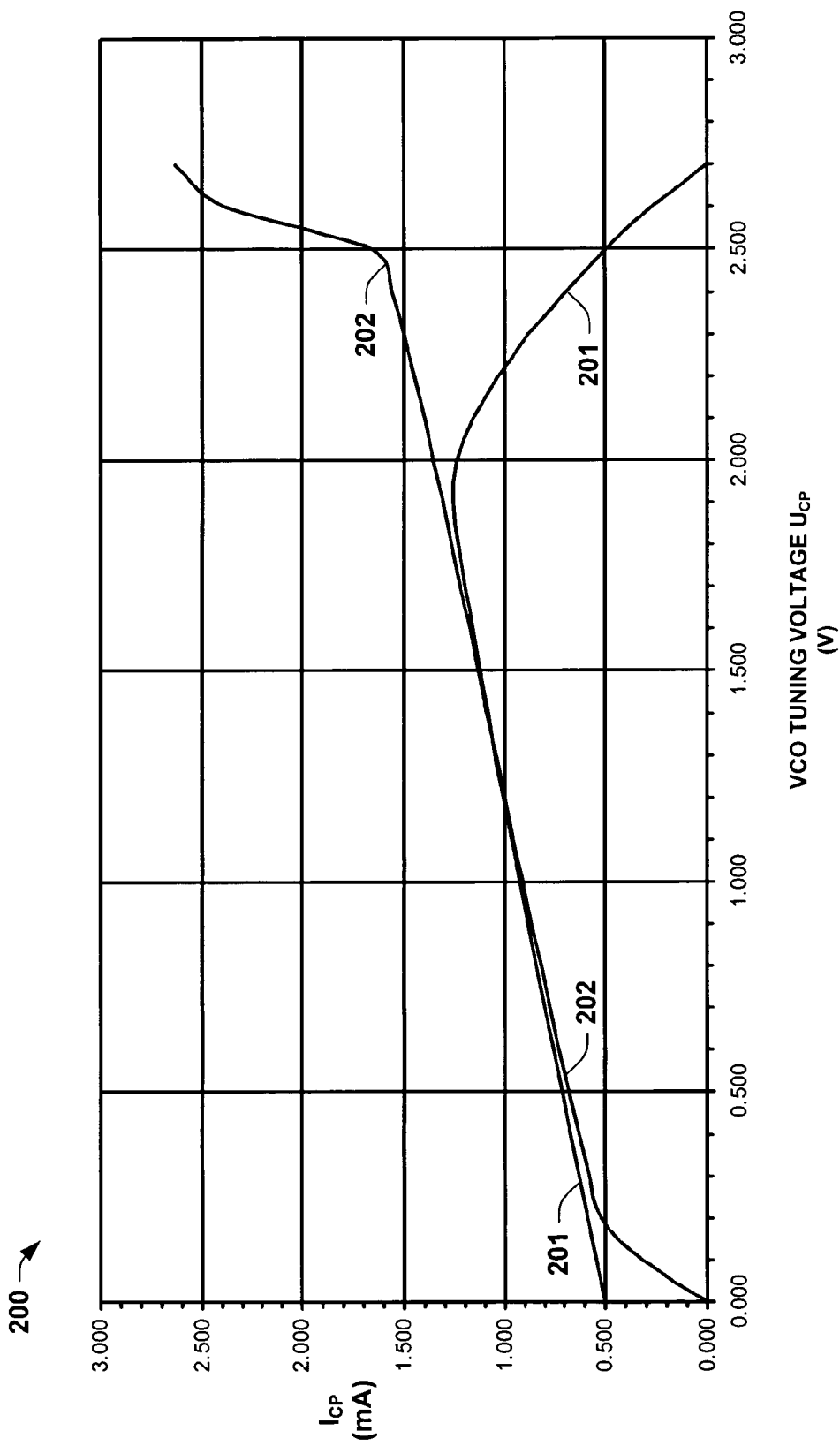
FIG. 5 is a plot illustrating source current and sink current vs. VCO tuning voltage curves for the PLL system of FIGS. 3–4C.

FIG. 5 illustrates a plot 200 that shows curves 201 and 202 of source current $I_{SOURCE}$ and sink current $I_{SINK}$ vs. VCO tuning voltage, respectively, for the exemplary PLL system 100 of FIG. 4A. As can be seen in the plot 200, the exemplary control circuit 120 provides source and sink current values for the charge pump bias current $I_{CP}$ that vary substantially linearly throughout a typical tuning voltage operating range of about 0.4 to about 2.1 V for a supply voltage VDD of about 2.7 V (e.g., between the voltage values at the second current mirror node 126b where the transistors Q1 and Q2 become pinched off).

Figure 6:
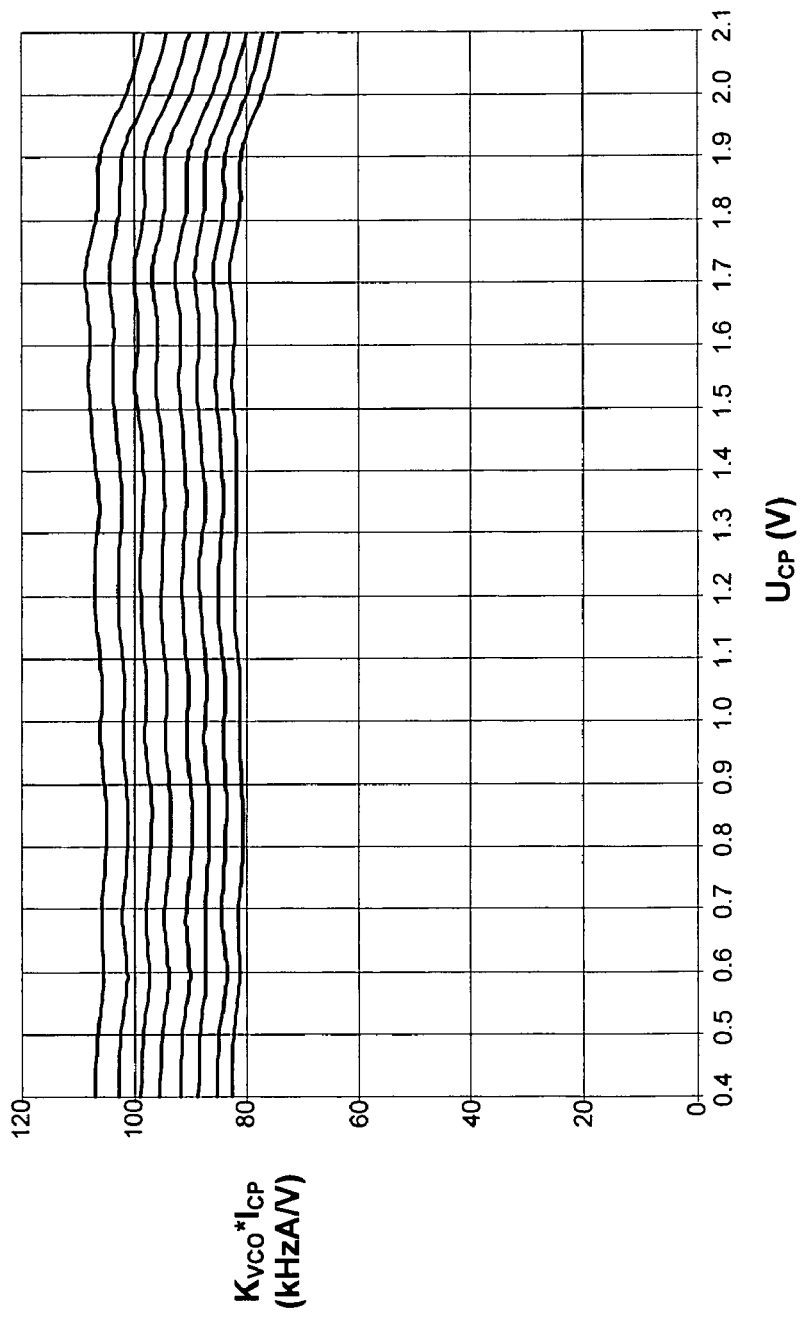
FIG. 6 is a plot illustrating various exemplary curves showing the tuning sensitivity charge pump current product ($K_{CVO}*I_{CP}$) as a function of the tuning voltage for the system of FIGS. 3–4C.

FIG. 6 illustrates the affect this has on the bias current/tuning sensitivity product $I_{CP}*K_{VCO}$. The plot 300 of FIG. 6 illustrates several $I_{CP}*K_{VCO}$ curves plotted as a function of the VCO tuning voltage $U_{CP}$, wherein the individual curves correspond to different programmable VCO frequency ranges in the exemplary VCO 110. As can be seen in FIG. 6, the $I_{CP}*K_{VCO}$ curves are generally flat, thus indicating the substantial proportionality of $I_{CP}$ and $K_{VCO}$ through operation of the control circuit 120 of the present invention. This further indicates that the affects of VCO tuning sensitivity has little or no affect on the open loop transfer function L(s) of the system 100, whereby the system 100 may be optimized for performance, for example, such as wide tuning band operation, without the stability and other performance limitations associated with VCO tuning sensitivity associated with conventional PLL designs.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A phase locked loop system, comprising:
    a phase detector providing at least one phase detector output signal according to a frequency reference input and to a feedback signal;
    a charge pump coupled with the phase detector, the charge pump providing a charge pump output signal at a charge pump output terminal according to the at least one phase detector output signal;
    a loop filter coupled with the charge pump, the loop filter providing a tuning voltage output according to the charge pump output signal;
    a voltage controlled oscillator coupled with the loop filter, the voltage controlled oscillator providing a frequency output signal according to the tuning voltage output;
    a feedback circuit coupled with the voltage controlled oscillator and the phase detector, the feedback circuit providing the feedback signal according to the frequency output signal; and
    a control circuit coupled with the charge pump and the voltage controlled oscillator, the control circuit comprising:
        a first current source selectively providing a first current to the charge pump according to the tuning voltage output, the first current being substantially proportional to the tuning voltage output, and
        a second current source providing a second current to the charge pump, the second current being substantially constant.

2. The system of claim 1, wherein the charge pump is adapted to selectively source a charge pump output current to the charge pump output terminal or to sink the charge pump output current from the charge pump output terminal according to the at least one phase detector output signal, the charge pump output current being substantially proportional to a sum of the first and second currents from the control circuit.

3. The system of claim 1, wherein the first current source of the control circuit comprises:
    an amplifier receiving the tuning voltage output from the loop filter; and
    a current mirror circuit coupled with the amplifier, the current mirror circuit selectively providing the first current to the charge pump according to an output of the amplifier.

4. The system of claim 3, wherein the current mirror circuit further comprises a switching circuit to selectively discontinue the first current according to a control signal.

5. The system of claim 3,
    wherein the current mirror circuit comprises:
        a first transistor having a first source/drain coupled with a supply voltage, a second source/drain coupled with a first node, and a gate coupled with a second node,
        a second transistor having a first source/drain coupled with the supply voltage, a second source/drain coupled with a third node, and a gate coupled with the second node, and
        a resistor coupled between the first node and ground; and
    wherein the amplifier comprises:
        a first input terminal coupled with the loop filter and the voltage controlled oscillator to receive the tuning voltage output;
        a second input terminal coupled with the first node of the current mirror circuit; and
        an output terminal providing an amplifier output to the second node of the current mirror circuit;
    wherein the amplifier maintains a voltage at the second node such that a voltage at the first node is substantially proportional to the tuning voltage output to create a current through the resistor and the first transistor that is substantially proportional to the tuning voltage output; and
    wherein the second transistor provides the first current to the third node, the third node being coupled with the charge pump, and the first current being substantially proportional to the current through the resistor.

6. The system of claim 5, wherein the current mirror circuit further comprises a switch coupled between the second node and the supply voltage to selectively discontinue the first current according to a control signal.

7. The system of claim 1, wherein the first current source comprises:
a current mirror circuit comprising:
a first transistor having a first source/drain coupled with a supply voltage, a second source/drain coupled with a first node, and a gate coupled with a second node,
a second transistor having a first source/drain coupled with the supply voltage, a second source/drain coupled with a third node, and a gate coupled with the second node, and
a resistor coupled between the first node and ground; and an amplifier comprising:
a first input terminal coupled with the loop filter and the voltage controlled oscillator to receive the tuning voltage output;
a second input terminal coupled with the first node of the current mirror circuit; and
an output terminal providing an amplifier output to the second node of the current mirror circuit;
wherein the amplifier maintains a voltage at the second node such that a voltage at the first node is substantially proportional to the tuning voltage output to create a current through the resistor and the first transistor that is substantially proportional to the tuning voltage output, and wherein the second transistor provides the first current to the third node, the third node being coupled with the charge pump, and the first current being substantially proportional to the current through the resistor.

8. The system of claim 7, wherein the current mirror circuit further comprises a switch coupled between the second node and the supply voltage to selectively discontinue the first current according to a control signal.

9. A phase locked loop system, comprising:
a phase detector providing at least one phase detector output signal according to a frequency reference input and to a feedback signal;
a charge pump coupled with the phase detector and receiving a charge pump bias current at a charge pump bias current input, the charge pump providing a charge pump output signal at a charge pump output terminal according to the at least one phase detector output signal by selectively sourcing a charge pump output current to the charge pump output terminal or sinking the charge pump output current from the charge pump output terminal according to the at least one phase detector output signal, the charge pump output current having a value substantially proportional to the charge pump bias current;
a loop filter coupled with the charge pump, the loop filter providing a tuning voltage output according to the charge pump output;
a voltage controlled oscillator coupled with the loop filter, the voltage controlled oscillator providing a frequency output signal according to the tuning voltage output;
a feedback circuit coupled with the voltage controlled oscillator and the phase detector, the feedback circuit providing the feedback signal according to the frequency output signal;
means for providing a first current to the charge pump bias current input, the first current being substantially proportional to the tuning voltage output; and
a second current source providing a second current to the charge pump bias current input, the second current being substantially constant, wherein the charge pump bias current is a sum of the first and second currents.

10. The system of claim 9, wherein the means for providing the first current comprises a first current source coupled with the charge pump and the voltage controlled oscillator, the first current source comprising:
an amplifier receiving the tuning voltage output from the loop filter; and
a current mirror circuit coupled with the amplifier, the current mirror circuit selectively providing the first current to the charge pump bias current input according to an output of the amplifier.

11. The system of claim 10, wherein the current mirror circuit further comprises a switching circuit to selectively discontinue the first current according to a control signal.

12. The system of claim 10,
wherein the current mirror circuit comprises:
a first transistor having a first source/drain coupled with a supply voltage, a second source/drain coupled with a first node, and a gate coupled with a second node,
a second transistor having a first source/drain coupled with the supply voltage, a second source/drain coupled with a third node, and a gate coupled with the second node, and
a resistor coupled between the first node and ground; and
wherein the amplifier comprises:
a first input terminal coupled with the loop filter and the voltage controlled oscillator to receive the tuning voltage output;
a second input terminal coupled with the first node of the current mirror circuit; and
an output terminal providing an amplifier output to the second node of the current mirror circuit;
wherein the amplifier maintains a voltage at the second node such that a voltage at the first node is substantially proportional to the tuning voltage output to create a current through the resistor and the first transistor that is substantially proportional to the tuning voltage output, wherein the second transistor provides the first current to the third node, wherein the third node is coupled with the charge pump bias current input, and wherein the first current is substantially proportional to the current through the resistor.

13. The system of claim 12, wherein the current mirror circuit further comprises a switch coupled between the second node and the supply voltage to selectively discontinue the first current according to a control signal.

14. The system of claim 9, wherein the first current source comprises:
a current mirror circuit comprising:
a first transistor having a first source/drain coupled with a supply voltage, a second source/drain coupled with a first node, and a gate coupled with a second node,
a second transistor having a first source/drain coupled with the supply voltage, a second source/drain coupled with a third node, and a gate coupled with the second node, and
a resistor coupled between the first node and ground; and an amplifier comprising:
a first input terminal coupled with the loop filter and the voltage controlled oscillator to receive the tuning voltage output;
a second input terminal coupled with the first node of the current mirror circuit; and
an output terminal providing an amplifier output to the second node of the current mirror circuit;
wherein the amplifier maintains a voltage at the second node such that a voltage at the first node is substantially proportional to the tuning voltage output to create a current through the resistor and the first transistor that is substantially proportional to the tuning voltage output, and wherein the second transistor provides the first current to the third node, the third node being coupled with the charge pump, the first current being substantially proportional to the current through the resistor.

15. The system of claim 14, wherein the current mirror circuit further comprises a switch coupled between the second node and the supply voltage to selectively discontinue the first current according to a control signal.

16. A phase locked loop system, comprising:
a phase detector providing at least one phase detector output signal according to a frequency reference input and to a feedback signal;
a charge pump coupled with the phase detector and receiving a charge pump bias current at a charge pump bias current input, the charge pump providing a charge pump output signal at a charge pump output terminal according to the at least one phase detector output signal by selectively sourcing a charge pump output current to the charge pump output terminal or sinking the charge pump output current from the charge pump output terminal according to the at least one phase detector output signal, the charge pump output current having a value substantially proportional to the charge pump bias current;
a loop filter coupled with the charge pump, the loop filter providing a tuning voltage output according to the charge pump output;
a voltage controlled oscillator coupled with the loop filter, the voltage controlled oscillator providing a frequency output signal according to the tuning voltage output;
a feedback circuit coupled with the voltage controlled oscillator and the phase detector, the feedback circuit providing the feedback signal according to the frequency output signal; and
means for providing a first current to the charge pump bias current input, the first current being substantially proportional to the tuning voltage output, wherein the means for providing the first current comprises a first current source coupled with the charge pump and the voltage controlled oscillator, the first current source selectively providing the first current to the charge pump bias current input according to the tuning voltage output, the first current source comprising:
an amplifier receiving the tuning voltage output from the loop filter; and
a current mirror circuit coupled with the amplifier, the current mirror circuit selectively providing the first current to the charge pump bias current input according to an output of the amplifier.

17. The system of claim 16,
wherein the current mirror circuit comprises:
a first transistor having a first source/drain coupled with a supply voltage, a second source/drain coupled with a first node, and a gate coupled with a second node,
a second transistor having a first source/drain coupled with the supply voltage, a second source/drain coupled with a third node, and a gate coupled with the second node, and
a resistor coupled between the first node and ground; and
wherein the amplifier comprises:
a first input terminal coupled with the loop filter and the voltage controlled oscillator to receive the tuning voltage output;
a second input terminal coupled with the first node of the current mirror circuit; and
an output terminal providing an amplifier output to the second node of the current mirror circuit;
wherein the amplifier maintains a voltage at the first node to create a current through the resistor and the first transistor that is substantially proportional to the tuning voltage output, wherein the second transistor provides the first current to the third node, wherein the third node is coupled with the charge pump bias current input, and wherein the first current is substantially proportional to the current through the resistor.

18. A phase locked loop system, comprising:
a phase detector providing at least one phase detector output signal according to a frequency reference input and to a feedback signal;
a charge pump coupled with the phase detector and receiving a charge pump bias current at a charge pump bias current input, the charge pump providing a charge pump output signal at a charge pump output terminal according to the at least one phase detector output signal by selectively sourcing a charge pump output current to the charge pump output terminal or sinking the charge pump output current from the charge pump output terminal according to the at least one phase detector output signal, the charge pump output current having a value substantially proportional to the charge pump bias current;
a loop filter coupled with the charge pump, the loop filter providing a tuning voltage output according to the charge pump output;
a voltage controlled oscillator coupled with the loop filter, the voltage controlled oscillator providing a frequency output signal according to the tuning voltage output;
a feedback circuit coupled with the voltage controlled oscillator and the phase detector, the feedback circuit providing the feedback signal according to the frequency output signal; and
means for providing a first current to the charge pump bias current input, the first current being substantially proportional to the tuning voltage output wherein the means for providing the first current comprises a first current source coupled with the charge pump and the voltage controlled oscillator, the first current source comprising:
a current mirror circuit comprising:
a first transistor having a first source/drain coupled with a supply voltage, a second source/drain coupled with a first node, and a gate coupled with a second node,
a second transistor having a first source/drain coupled with the supply voltage, a second source/drain coupled with a third node, and a gate coupled with the second node, the third node being coupled with the charge pump, and
a resistor coupled between the first node and ground; and
an amplifier comprising:
a first input terminal coupled with the loop filter and the voltage controlled oscillator to receive the tuning voltage output;
a second input terminal coupled with the first node of the current mirror circuit; and
an output terminal providing an amplifier output to the second node of the current mirror circuit;
wherein the amplifier maintains a voltage at the second node such that a voltage at the first node is substantially proportional to the tuning voltage output to create a current through the resistor and the first transistor that is substantially proportional to the tuning voltage output, and wherein the second transistor provides the first current to the third node that is substantially proportional to the current through the resistor.

19. A control circuit for providing a bias current to a charge pump in a phase locked loop system, the control circuit comprising:
a first current source coupled with the charge pump of the phase locked loop system and with a VCO of the phase locked loop system, the first current source selectively providing a first current to the charge pump, the first current being substantially proportional to a tuning voltage at a VCO input of the phase locked loop system; and
a second current source providing a second current to the charge pump, the second current being substantially constant.

20. The control circuit of claim 19, wherein the first current source comprises:
an amplifier receiving the tuning voltage; and
a current mirror circuit coupled with the amplifier and selectively providing the first current to the charge pump according to an output of the amplifier.

21. The control circuit of claim 20, wherein the current mirror circuit further comprises a switching circuit to selectively discontinue the first current according to a control signal.

22. The control circuit of claim 20,
wherein the current mirror circuit comprises:
a first transistor having a first source/drain coupled with a supply voltage, a second source/drain coupled with a first node, and a gate coupled with a second node,
a second transistor having a first source/drain coupled with the supply voltage, a second source/drain coupled with a third node, and a gate coupled with the second node, and
a resistor coupled between the first node and ground; and
wherein the amplifier is an op-amp comprising:
a first input terminal coupled with the VCO input to receive the tuning voltage;
a second input terminal coupled with the first node; and
an output terminal providing an amplifier output to the second node;
wherein the amplifier maintains a voltage at the second node such that a voltage at the first node is substantially proportional to the tuning voltage to create a current through the resistor and the first transistor that is substantially proportional to the tuning voltage, and wherein the second transistor provides the first current to the third node, the third node being coupled with the charge pump, and the first current being substantially proportional to the current through the resistor.

23. The control circuit of claim 22, wherein the current mirror circuit further comprises a switch coupled between the second node and the supply voltage to selectively discontinue the first current according to a control signal.

24. The control circuit of claim 19, wherein the first current source comprises:
a current mirror circuit comprising:
a first transistor having a first source/drain coupled with a supply voltage, a second source/drain coupled with a first node, and a gate coupled with a second node,
a second transistor having a first source/drain coupled with the supply voltage, a second source/drain coupled with a third node, and a gate coupled with the second node, and
a resistor coupled between the first node and ground; and
an amplifier comprising:
a first input terminal coupled with the VCO input to receive the tuning voltage;
a second input terminal coupled with the first node; and
an output terminal providing an amplifier output to the second node;
wherein the amplifier maintains a voltage at the first node to create a current through the resistor and the first transistor that is substantially proportional to the tuning voltage, and wherein the second transistor provides the first current to the third node, the third node being coupled with the charge pump, and the first current being proportional to the current through the resistor.

25. The control circuit of claim 24, wherein the current mirror circuit further comprises a switch coupled between the second node and the supply voltage to selectively discontinue the first current according to a control signal.

26. A control circuit for providing a bias current to a charge pump in a phase locked loop system, the control circuit comprising:
a first current source coupled with the charge pump of the phase locked loop system and with a VCO of the phase locked loop system, the first current source comprising:
means for sensing a tuning voltage at a VCO input of the phase locked loop system, and
means for selectively providing a first current to the charge pump that is substantially proportional to the tuning voltage; and
a second current source providing a second current to the charge pump, the second current being substantially constant.

27. A control circuit for providing current to a charge pump in a phase locked loop system, the control circuit comprising:
a current mirror circuit comprising:
a first transistor having a first source/drain coupled with a supply voltage, a second source/drain coupled with a first node, and a gate coupled with a second node,
a second transistor having a first source/drain coupled with the supply voltage, a second source/drain coupled with a third node, and a gate coupled with the second node, and
a resistor coupled between the first node and ground; and
an amplifier comprising:
a first input terminal coupled with a VCO in the phase locked loop system to receive a tuning voltage at an input of the VCO;
a second input terminal coupled with the first node; and
an output terminal providing an amplifier output to the second node;
wherein the amplifier maintains a voltage at the first node to create a current through the resistor and the first transistor that is substantially proportional to the tuning voltage, and wherein the second transistor provides the first current to the third node, the third node being coupled with the charge pump, and the first current being proportional to the current through the resistor.

28. A method of providing a bias current to a charge pump in a phase locked loop system, the method comprising:

sensing a tuning voltage at a VCO input of the phase locked loop system;

selectively providing a first current to the charge pump that is substantially proportional to the tuning voltage; and providing a second current to the charge pump, the second current being substantially constant.

29. The method of claim 28, further comprising selectively discontinuing the first current according to a control signal.

30. A method of biasing a charge pump in a phase locked loop system, the method comprising:

selectively providing a first current to the charge pump using a first current source;

controlling the first current according to a VCO tuning voltage of the phase locked loop system; and providing a second current to the charge pump, the second current being substantially constant.

31. The method of claim 30, wherein controlling the first current according to the VCO tuning voltage comprises controlling the first current to be substantially proportional to the VCO tuning voltage.

32. The method of claim 31, further comprising selectively discontinuing the first current according to a control signal.

33. The method of claim 30, further comprising selectively discontinuing the first current according to a control signal.

* * * * *